(12) United States Patent
Imamiya et al.

(10) Patent No.: US 6,597,602 B2
(45) Date of Patent: Jul. 22, 2003

(54) SEMICONDUCTOR MEMORY DEVICE

(75) Inventors: Kenichi Imamiya, Tokyo (JP); Hiroshi Nakamura, Fujisawa (JP); Koji Hosono, Yokohama (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/956,937

(22) Filed: Sep. 21, 2001

(65) Prior Publication Data

US 2002/0036926 A1 Mar. 28, 2002

(30) Foreign Application Priority Data

Sep. 22, 2000 (JP) ........................................ 2000-289314

(51) Int. Cl.$^7$ .............................................. G11C 16/04
(52) U.S. Cl. ............................ 365/185.04; 365/185.08; 365/185.29
(58) Field of Search ....................... 365/185.29, 185.04, 365/185.23, 174, 195, 185.08, 185.2

(56) References Cited

U.S. PATENT DOCUMENTS

| 4,451,903 A | 5/1984 | Jordan et al. ................. 365/94 |
| 5,508,543 A | 4/1996 | Hartstein et al. ...... 365/189.05 |
| 5,523,974 A | 6/1996 | Hirano et al. ................ 365/200 |
| 5,854,332 A | * 12/1998 | Inoue et al. ................. 365/195 |
| 6,032,237 A | * 2/2000 | Inoue et al. ................. 365/195 |
| 6,052,313 A | 4/2000 | Atsumi et al. .......... 365/189.05 |
| 6,304,100 B1 | * 10/2001 | Kobayashi .................... 326/40 |
| 6,462,985 B2 | 10/2002 | Hosono et al. ......... 365/185.09 |

FOREIGN PATENT DOCUMENTS

| JP | 08-044628 | 2/1996 |
| JP | 09180482 A | * 7/1997 |
| JP | 10108348 A | * 4/1998 |
| JP | 2000-112826 | 1/2000 |

\* cited by examiner

*Primary Examiner*—Richard Elms
*Assistant Examiner*—Hien Nguyen
(74) *Attorney, Agent, or Firm*—Banner & Witcoff, Ltd.

(57) ABSTRACT

A semiconductor memory device is provided which includes a rewrite-inhibited region for individual certification. Non-volatile memory elements constituting a memory cell array are used instead of a conventionally used fuse element to form the rewrite-inhibited region for individual certification. A voltage at high level is applied to a pad formed on a chip with a probe before the chip is sealed in a package to set the non-volatile memory elements in the rewrite-inhibited region to a writable state. After data for individual certification is written thereto, the chip is sealed in a package to disable electrical connection from outside to the pad set to a voltage at low level with a pull-down resistor.

19 Claims, 2 Drawing Sheets

SEMICONDUCTOR MEMORY DEVICE

CROSS-REFERENCE TO RELATED APPLICATIONS

This application is based upon and claims the benefit of priority from the prior Japanese Patent Application No. 2000-289314, filed Sep. 22, 2000, the entire contents of which are incorporated herein by reference.

BACKGROUND OF THE INVENTION

1. Field of the Invention

The present invention relates to a semiconductor memory device, and more particularly to a rewritable non-volatile semiconductor memory device using a rewritable non-volatile memory element as in a rewritable memory section for a user for storing data which is inhibited from rewriting such as individual information.

2. Description of the Related Art

In conventional semiconductor memory devices, it may be desirable to inhibit rewriting of some stored data. For example, when copyrighted information such as music is stored in a large capacity semiconductor memory device, individual certification is required for each semiconductor chip to secure the copy right.

For individual certification, it is necessary to output unique data for individual certification written to each semiconductor chip. Thus, different rewrite-inhibited data must be stored in each semiconductor chip with certain means.

The simplest method to achieve the aforementioned object is to make use of the characteristic of nonvolatile memory elements constituting a memory region of a semiconductor memory device being a writable memory such that data is written to a non-volatile memory element formed as in a typical memory region after a wafer process. Such a non-volatile memory element disposed in a memory cell array similar to a typical memory area is preferable for a higher degree of integration since write circuits and read circuits can be shared.

When the non-volatile memory element is rewritable, however, rewriting must be possible before rewrite-inhibited data is stored and a problem occurs in that rewriting is permitted in a rewrite-inhibited memory region through input of an electrical signal unless certain physical changes are added to a semiconductor chip. To address this, conventionally, a circuit as shown in FIG. 1 has been used to disable alteration of written data after the writing of the data to a rewrite-inhibited region in a memory cell array.

The circuit shown in FIG. 1 comprises a row decoder 60 for selecting a word line in a rewrite-inhibited region, and a non-volatile data region (memory cell array) 100 including a rewrite-inhibited region comprising nonvolatile memory elements Q10, Q11 and the like. In the conventional circuit shown in FIG. 1, the rewrite-inhibited region is disposed in the typical non-volatile data region 100 open to general users. A word line in the rewrite-inhibited region is selected by activating the row decoder 60 different from a typical row decoder selected with an address.

Next, the operation of the row decoder 60 will be described. As described above, the functions required for the rewrite-inhibited region for individual certification are to inhibit data rewriting after data for individual certification is written to each semiconductor chip and to allow reading of the written data for individual certification in a rewrite-inhibited state at the time of individual certification.

In the row decoder 60 shown in FIG. 1, a fixed high-level voltage $V_0$ is input to the gates of N-channel transistors Q1, Q2, and Q3, which would receive address signal in a typical row decoder, to turn on the N-channel transistors Q1, Q2, and Q3. A signal $V_0$ is an activation signal for the row decoder. The signal $\phi$ going high turns on an N-channel transistor Q4 and turns off a P-channel transistor Q6 to separate a power supply voltage at high level provided for the source of the P-channel transistor Q6.

If a fuse element is connected, a selection signal X at high level for rewrite-inhibited region is input to the gate of an N-channel transistor Q5 to set the voltage at a node N1 to low level (ground).

The low-level voltage at the node N1 is applied as a voltage at high level to the gate of a pass-transistor Q8 for selecting a word line in the rewrite-inhibited region through a latch circuit including an inverter 13 and a P-channel transistor Q7 and a voltage conversion circuit 14 to turn on the pass-transistor Q8, thereby applying a word line selection voltage to the gates of the non-volatile memory elements Q10, Q11 and the like in the rewrite-inhibited region included in the memory cell array to write data for individual certification. In this case, since an N-channel transistor Q9 is short-circuited with the fuse element, it is not involved in the operation of the row decoder 60.

To inhibit rewriting of the data thus written for individual certification, the fuse element formed on the wafer using a metal layer is blown through laser processing. At this point, since a read mode signal is at low level and thus the N-channel transistor Q9 is off, and the node N1 is released from the low level, a voltage at low level is applied to the gate of the pass-transistor Q8 through the inverter 13 of the latch circuit and the voltage conversion circuit 14 to turn off the pass-transistor Q8, thereby inhibiting writing of data to the memory elements Q10, Q11 and the like.

When the read mode signal is driven high level with the fuse element blown, the N-channel transistor Q9 is turned on and the node N1 goes low. A word line can be selected using the pass-transistor Q8 to read the data for individual certification written to the non-volatile memory elements Q10, Q11 and the like in the rewrite-inhibited region.

As described above, rewriting has conventionally been inhibited by blowing the fuse element in the row decoder 60 for selection in the rewrite-inhibited memory region. The use of the method, however, requires laser processing for accurately blowing the fuse with laser and takes a long time for a test step after the semiconductor chip fabrication to result in a problem of increased manufacturing cost.

As mentioned above, since a conventional semiconductor memory device capable of individual certification is provided with a rewrite-inhibited function using the blowing of a fuse element, a long time is required for a test step after the semiconductor chip fabrication to cause a problem of increased manufacturing cost.

BRIEF SUMMARY OF THE INVENTION

A semiconductor memory device according to an embodiment of the present invention employs non-volatile memory elements typically constituting a memory cell array to form a rewrite-inhibited region for individual certification instead of a conventionally used fuse element. Before a semiconductor chip is sealed in a package, a voltage at high level is applied to a pad on the semiconductor chip with a probe or the like to set the non-volatile memory elements in the rewrite-inhibited region to a writable state. After data for individual certification is written thereto, the chip is sealed in a package to disable electrical connection to the pad from outside, thereby inhibiting rewriting of the data.

Specifically, a semiconductor memory device according to an embodiment of the preset invention comprises a rewritable non-volatile memory element, an erase circuit configured to erase storage data written to the non-volatile memory element, a circuit configured to write storage data to the non-volatile memory element, a circuit configured to read storage data written to the non-volatile memory element, and a pad formed by opening a passivation film on a surface of a semiconductor chip, wherein erasing and writing of storage data in the non-volatile memory element are allowed by inputting a signal at a first voltage level to the pad, and erasing or writing of storage data in the non-volatile memory element are inhibited by inputting a signal at a second voltage level to the pad.

A semiconductor memory device according to another embodiment of the present invention comprises a memory cell array including non-volatile memory elements. The memory cell array includes a non-volatile memory element forming a rewritable data region for a user and a non-volatile memory element forming a rewrite-inhibited region for individual certification. Erasing or writing of storage data in the non-volatile memory element forming the rewrite-inhibited region are inhibited by setting one of a row selection circuit and a column selection circuit for the memory cell array to an unselected state.

DETAILED DESCRIPTION OF THE INVENTION

Some embodiments of the present invention will be hereinafter described with reference to the drawings.

First Embodiment

Figure 2:
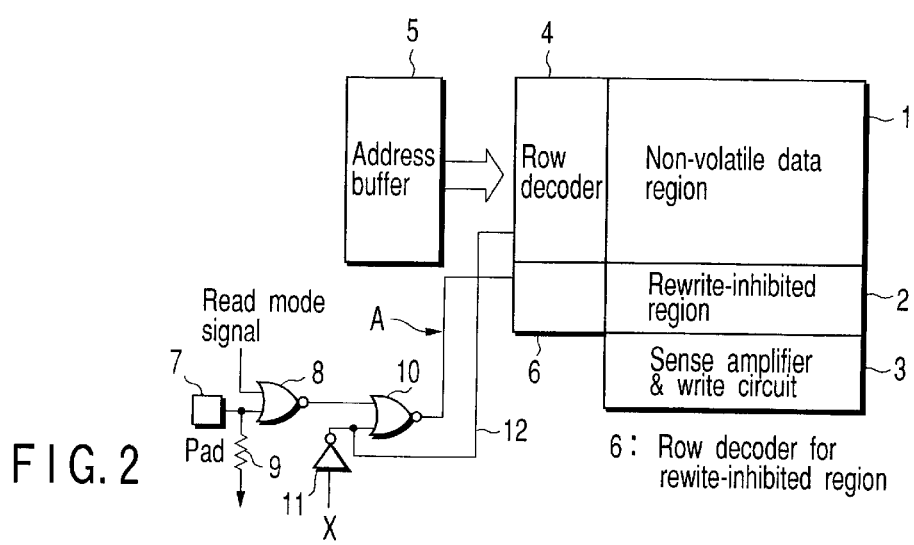
FIG. 2 shows the configuration of a semiconductor memory device according to a first embodiment of the present invention.

FIG. 2 shows the configuration of a semiconductor memory device having an individual certification function according to a first embodiment. The semiconductor memory device shown in FIG. 2 comprises a non-volatile data region 1 for a user in which data is rewritable, a rewrite-inhibited region 2 for storing data for individual certification, formed of nonvolatile memory elements similar to those of the nonvolatile data region 1, a sense amplifier and write circuit 3, a row decoder 4, an address buffer 5, a row decoder 6 for rewrite-inhibited region for selecting a word line in the rewrite-inhibited region 2, a pad 7 formed on a semiconductor chip, a circuit including NOR gates 8, 10, a resistor 9, and an inverter 11, and a signal line 12 for inactivating the row decoder 4.

The non-volatile data region 1 and the rewrite-inhibited region 2 constitute an array including a series of memory cells such that bit lines for common columns in the memory cell array are shared between the non-volatile data region rewritable by a user and the rewrite-inhibited region 2 to which data for individual certification is written and are connected to the sense amplifier and write circuit 3. The rewritable non-volatile data region 1 and the rewrite-inhibited region 2 are connected to different word lines and selected using the typical row decoder 4 and the row decoder 6 for rewrite-inhibited region, respectively.

Figure 1:
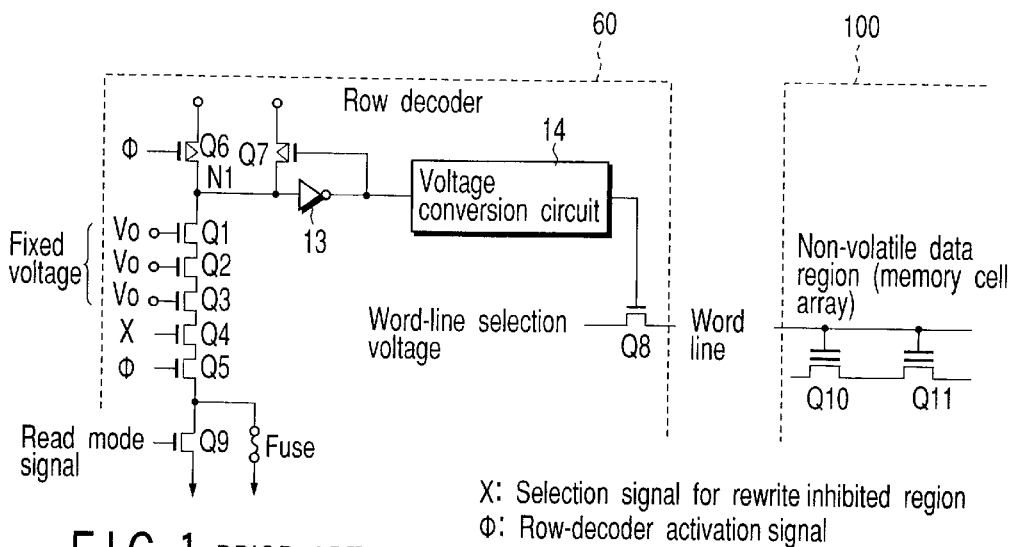
FIG. 1 shows the configuration of a conventional semiconductor memory device including a rewrite-inhibited region.
Figure 3:
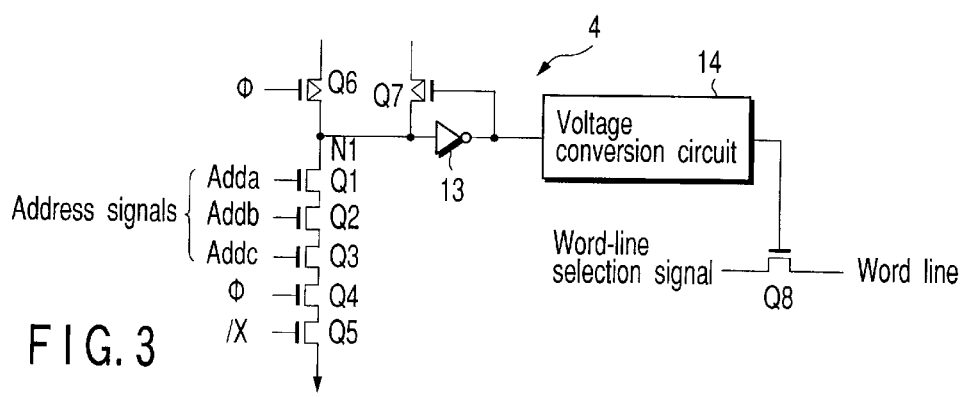
FIG. 3 shows the circuit configuration of a typical row decoder of the semiconductor memory device according to the first embodiment.

The circuit configuration and the operation of the typical row decoder 4 will be hereinafter described with reference to FIGS. 2 and 3. Since the circuit configuration of the typical row decoder 4 shown in FIG. 3 is substantially similar to the circuit configuration of the conventional row decoder 60 described earlier with reference to FIG. 1, difference between the configuration in FIG. 3 and that in FIG. 1 will be described particularly in detail with the corresponding portions designated the same reference symbols and numerals.

The typical non-volatile data region 1 shown in FIG. 2 allows erasing, writing, and reading data through selection of one word line in response to output from the address buffer 5. In FIG. 3, a signal φ activates the row decoder 4. When the activation signal φ is at low level, a P-channel transistor Q6 is turned on to provide a power supply voltage at high level for a node N1, and a voltage at low level is applied to the gate of a pass-transistor Q8 through an inverter 13 of a latch circuit and a voltage conversion circuit 14 to set all row decoders 4 to an unselected state.

When all address signals Adda, Addb, and Addc input to the gates of N-channel transistors Q1, Q2, and Q3, respectively, are at high level and a rewrite-inhibited region selection signal X input to the gate of an N-channel transistor Q5 is low (/X is high in FIG. 3), the activation signal φ changed high discharges and sets the node N1 to low level, the row decoder 4 enters into a selected state.

The low-level voltage at the node N1 is converted to a voltage at high level through the inverter 13 of the latch circuit and the voltage conversion circuit 14 and applied to the gate of the pass-transistor Q8 to send a word line selection signal to a word line. Thus, depending on an operation mode, erasing, writing, and reading operations can be performed.

Next, the circuit configuration and the operation of the row decoder 6 for rewrite-inhibited region will be described with reference to FIGS. 2 and 4. While the row decoder 6 for rewrite-inhibited region shown in FIG. 4 has the same configuration as the typical row decoder 4 shown in FIG. 3, a fixed voltage $V_0$ is input to the gates of N-channel transistors Q1, Q2, and Q3 instead of an address signal input thereto in the typical row decoder 4, and the selected or unselected row decoder 6 for rewrite-inhibited region is determined only by input of a signal A to the N-channel transistor Q5.

As shown in FIG. 2, the signal A is output from a circuit comprising the pad 7 formed by opening a passivation film on the semiconductor chip, the NOR gates 8, 10, the resistor 9, and the inverter 11. The voltage level of the signal A is determined by a rewrite-inhibited region selection signal X generated in a control circuit (not shown), a read mode signal, and the level of voltage applied to the pad 7.

In the first place, description will be made on writing of data for individual certification to the rewrite-inhibited region.

Figure 4:
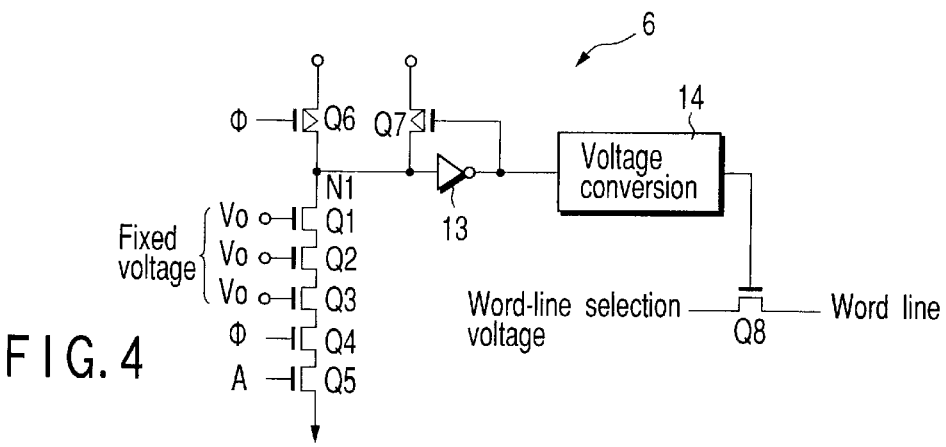
FIG. 4 shows the circuit configuration of a row decoder for rewrite-inhibited region of the semiconductor memory device according to the first embodiment.

When the pad 7 shown in FIG. 2 is at high level and the control circuit is in a rewrite-inhibited region selection mode to transmit a rewrite-inhibited region selection signal X at high level, the signal A at high level is output from the NOR gate 10 to turn on an N-channel transistor Q5 in FIG. 4 to set the node N1 to low level. The low level of the node N1 is converted to a voltage at high level through an inverter 13 of a latch circuit and a voltage conversion circuit 14 and applied to the gate of a pass-transistor Q8 to transfer a word line selection voltage to a word line, thereby making it possible to perform operations for erasing, writing, and reading on the rewrite-inhibited region 2 as in the typical nonvolatile data region 1.

Next, description will be made on rewriting inhibition of individual certification data and reading.

When the pad 7 is grounded through the resistor 9, for example, as shown in FIG. 2, the pad 7 is at low level while it is open. When the control circuit is in a read mode to set the read mode signal input to the NOR gate 8 to high level, and the control circuit is in a rewrite-inhibited region selection mode to set the rewrite-inhibited region selection signal X to high level, the output A from the NOR gate 10 is at high level to permit only reading of the individual certification data stored in the rewrite-inhibited region 2 and thus data cannot be rewritten.

In the manufacturing process of a non-volatile semiconductor memory device, unique data for individual certification is written to each chip upon the end of test at a wafer level. At this point, for allowing writing to a rewrite-inhibited region, a probe is used to input a voltage at high level to the pad 7 shown in FIG. 2.

Thereafter, in an assembly step, the chip is sealed in a package with the pad open. As described above, since the pad 7 is grounded (pull down) through the resistor 9, the open pad 7 sealed in the package is at low level. Thus, only reading is permitted for the individual certification data stored in the rewrite-inhibited region 2, and writing thereof is permanently inhibited unless the package is opened.

Second Embodiment

Next, a non-volatile semiconductor memory device according to a second embodiment will be hereinafter described with reference to FIGS. 5 and 6. The second embodiment is characterized by using a signal B to control transmission of a write command for the non-volatile semiconductor memory device, unlike the first embodiment.

Figure 5:
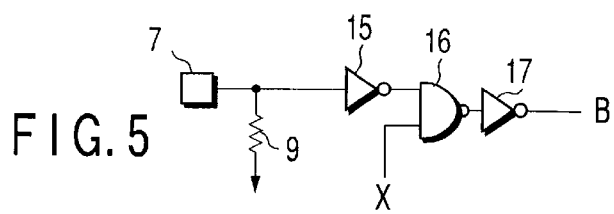
FIG. 5 shows a circuit for producing a signal B according to a second embodiment.

FIG. 5 shows a circuit for producing the signal B comprising a pad 7 formed on a semiconductor chip, a pull-down resistor 9, inverters 15, 17, and a NAND gate 16. The NAND gate 16 has one input terminal applied with a rewrite-inhibited region selection signal X. FIG. 6 shows a circuit for controlling the transmission of the write command, comprising a control circuit 18 for producing the write command in accordance with an external input signal and an AND gate 19. The AND gate 19 has one input terminal applied with the signal B.

When the rewrite-inhibited region selection signal X is at high level to select the rewrite-inhibited region 2 shown in FIG. 2 and the pad 7 is at low level, the signal B at high level is output from the circuit in FIG. 5. Thus, the write command at high level produced in the control circuit 18 in FIG. 6 is changed to a write signal at high level through the AND gate 19 to allow writing of individual certification data to the rewrite-inhibited region 2.

On the other hand, when the rewrite-inhibited region selection signal X is at high level to select the rewrite-inhibited region 2 shown in FIG. 2, and the pad 7 is at high level, the signal B at low level is output from the circuit in FIG. 5. The write command at high level produced in the control circuit 18 in FIG. 6 is blocked by the AND gate 19 and no write signal is transmitted. Thus, data writing to the rewrite-inhibited region 2 is inhibited.

Figure 6:
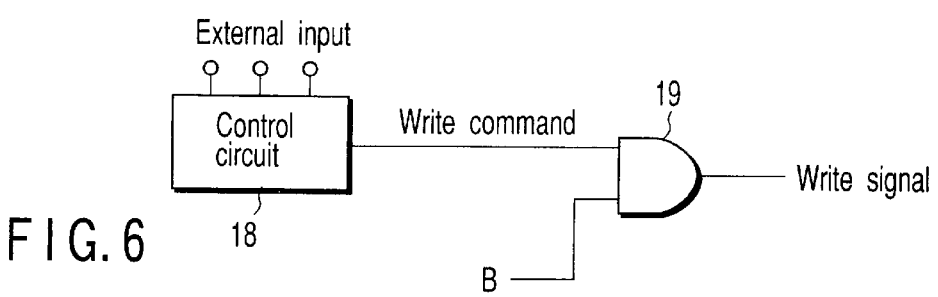
FIG. 6 shows a control circuit for a write command according to the second embodiment.

Since similar control of an erase command for the semiconductor memory device can inhibit erasing of the individual certification data written to the rewrite-inhibited region 2, the circuits shown in FIGS. 5 and 6 can be used to inhibit rewriting of the individual certification data written to the rewrite-inhibited region 2.

Third Embodiment

Next, a non-volatile semiconductor memory device according to a third embodiment will be described with reference to FIG. 7. The third embodiment is characterized by using a signal B to control production of a high voltage required for writing and erasing in the non-volatile semiconductor memory device, unlike the second embodiment.

Figure 7:
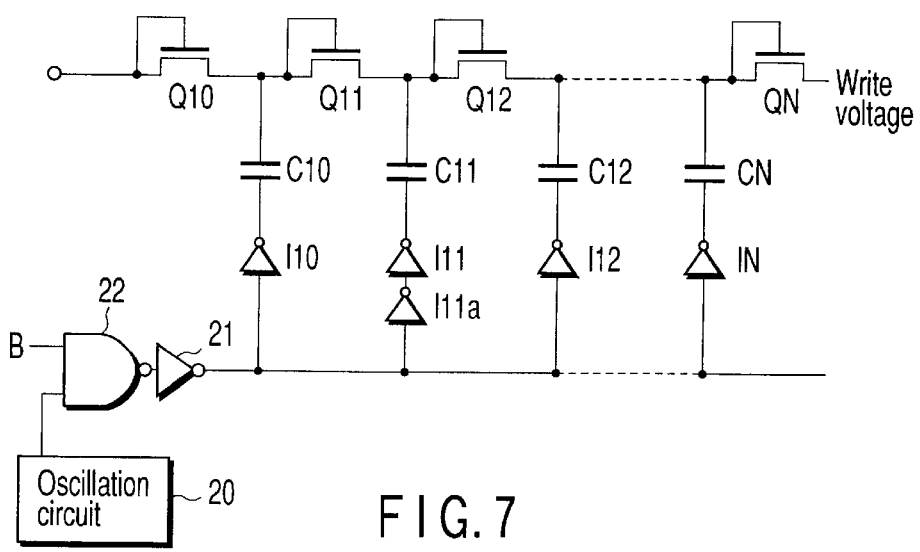
FIG. 7 shows a control circuit for write voltage according to a third embodiment.

FIG. 7 shows the configuration of a charge pump circuit for producing a high voltage required for writing and erasing and a control circuit with the signal B. The charge pump circuit shown in FIG. 7 comprises diode-connected N-channel transistors Q10 to QN, capacitors C10 to CN for storing charge, inverters I10, I11, I11a, I12, . . . IN for phase inversion required for pumping, an oscillation circuit 20, an inverter 21 and a NAND gate 22 for controlling the output from the oscillation circuit 20 using the signal B. The signal B is input to one terminal of the NAND gate 22.

When the output from the oscillation circuit 20 shown in FIG. 7 is blocked using the circuit for producing the signal B shown in FIG. 5, a high voltage required for writing and erasing cannot be produced to inhibit rewriting of individual certification data written to the rewrite-inhibited region 2.

The present invention is not limited to the aforementioned embodiments. For example, while the first embodiment uses the pull-down resistor for setting the pad to the low level state with the pad open before the chip is sealed in a package, a pull-up resistor can be used to achieve the same object with an inverted logical circuit for producing the signal A.

In addition, the aforementioned embodiments have been described for the unselected row selection circuit of the memory cell array forming the rewrite-inhibited region to erase and write the storage data in the nonvolatile memory element, erasing and writing of the storage data in the non-volatile memory elements constituting the rewrite-inhibited region can also be inhibited by setting a column selection circuit to an unselected state. The present invention can be embodied with various modifications added thereto without departing from the spirit and scope of the present invention.

As described above, according to the semiconductor device of the present invention, a rewrite-inhibited region for individual certification is formed using elements similar to typical non-volatile memory elements constituting a memory cell array, and a conventional means such as blowout of a fuse element is not required for providing a rewrite-inhibited function, thereby making it possible to provide a semiconductor memory device including a rewrite-inhibited region for individual certification without increasing manufacturing cost.

What is claimed is:

1. A semiconductor memory device comprising:
   a rewritable non-volatile memory element;
   a write circuit configured to write storage data to said non-volatile memory element;
   a read circuit configured to read storage data written to said non-volatile memory element;
   a pad configured to receive a voltage; and
   a logic circuit connected between the pad and the write and read circuits,
   wherein writing of storage data in said non-volatile memory element are allowed by inputting a signal at a first voltage level to said pad, and writing of storage data in said non-volatile memory element are inhibited by inputting a signal at a second voltage level to said pad.

2. The semiconductor memory device according to claim 1, wherein writing of storage data in said non-volatile memory element are inhibited by setting said pad to an open state instead of the input of a signal at said second voltage level to said pad.

3. The semiconductor memory device according to claim 1, further comprising a rewrite-inhibited memory region including said non-volatile memory element having a function of enabling writing of storage data in said non-volatile memory element before the semiconductor chip is sealed in a package, and a function of inhibiting writing of storage data in said non-volatile memory element after said semiconductor chip is sealed in a package.

4. The semiconductor memory device according to claim 2, further comprising a rewrite-inhibited memory region including said non-volatile memory element having a function of enabling writing of storage data in said non-volatile memory element before the semiconductor chip is sealed in a package, and a function of inhibiting writing of storage data in said non-volatile memory element after said semiconductor chip is sealed in a package.

5. The semiconductor memory device according to claim 1, wherein said storage data is data for individual certification of said semiconductor chip.

6. The semiconductor memory device according to claim 2, wherein said storage data is data for individual certification of said semiconductor chip.

7. The semiconductor memory device according to claim 3, wherein said storage data is data for individual certification of said semiconductor chip.

8. The semiconductor memory device according to claim 4, wherein said storage data is data for individual certification of said semiconductor chip.

9. The semiconductor memory device according to claim 1, wherein said non-volatile memory element in which writing of said storage data are inhibited forms part of a rewrite-inhibited memory region, and has the same writing mechanism as a non-volatile memory element which forms part of a rewritable memory region in which writing of said storage data are enabled.

10. The semiconductor memory device according to claim 1, wherein said signal at said second voltage level is a signal at a voltage level corresponding to either logic "0" or logic "1", and said signal at said second voltage level is provided for said pad by connecting said pad to a power supply terminal at a voltage level corresponding to either said logic "0" or said logic "1" when said semiconductor chip is sealed in a package.

11. The semiconductor memory device according to claim 1, wherein said signal at said second voltage level is a signal at a voltage level corresponding to either logic "0" or logic "1", and said signal at said second voltage level is provided for said pad by connecting said pad through a resistor element to a power supply terminal at a voltage level corresponding to either said logic "0" or said logic "1" when said semiconductor chip is sealed in a package.

12. A semiconductor memory device comprising a memory cell array including a non-volatile memory element,
   said memory cell array including a non-volatile memory element forming a rewritable data region for a user and a non-volatile memory element forming a rewrite-inhibited region for individual certification,
   writing of storage data in said non-volatile memory element forming said rewrite-inhibited region are inhibited by setting one of a row selection circuit and a column selection circuit for said memory cell array to an unselected state.

13. The semiconductor memory device according to claim 12, wherein writing of storage data in said non-volatile memory element forming said rewrite-inhibited region are inhibited by inactivating a write command for said semiconductor memory device instead of setting one of a row selection circuit and a column selection circuit for said memory cell array to an unselected state.

14. The semiconductor memory device according to claim 12, wherein writing of storage data in said non-volatile memory element forming said rewrite-inhibited region are inhibited by inactivating a voltage boosting circuit for said semiconductor memory device required for writing in said semiconductor memory device instead of setting one of a row selection circuit and a column selection circuit for said memory cell array to an unselected state.

15. A semiconductor memory device comprising a memory cell array including a non-volatile memory element,
   said memory cell array including a non-volatile memory element forming a rewritable data region for a user and a non-volatile memory element forming a rewrite-inhibited region for individual certification,
   writing of storage data in said non-volatile memory element forming said rewrite-inhibited region are inhibited by inactivating a write command for said semiconductor memory device.

16. A semiconductor memory device comprising a memory cell array including a non-volatile memory element,
   said memory cell array including a non-volatile memory element forming a rewritable data region for a user and a non-volatile memory element forming a rewrite-inhibited region for individual certification,
   writing of storage data in said non-volatile memory element forming said rewrite-inhibited region are inhibited by inactivating a voltage boosting circuit for said semiconductor memory device required for writing in said semiconductor memory device.

17. A semiconductor memory device comprising:
   a first memory cell array having a plurality of rewritable non-volatile memory elements;
   a second memory cell array having a plurality of rewritable non-volatile memory elements;
   a first select circuit which selects the memory elements in the first memory cell array in accordance with an address signal;

a second select circuit which selects the memory elements in the second memory cell array in accordance with an address signal;

a pad configured to receive a signal; and a logic circuit connected between the pad and the first and second select circuits, the logic circuit being activated when the pad receives a first signal of a first voltage level, and activating the second selecting circuit when the logic circuit receives a second signal of a first voltage level, wherein the pad is in an open state after a data is written into the second memory cell array.

18. The device according to claim 17, wherein the logic circuit is activated when the pad receives the first signal of a first voltage level, and activating the first selecting circuit when the logic circuit receives the second signal of a second voltage level.

19. The device according to claim 17, wherein the logic circuit is activated when the pad is in an open state and receives a read mode signal, and activating one of the first and second selecting circuits in accordance with a voltage level of the second signal received by the logic circuit.

* * * * *

UNITED STATES PATENT AND TRADEMARK OFFICE
CERTIFICATE OF CORRECTION

PATENT NO. : 6,597,602 B2 Page 1 of 1
DATED : July 22, 2003
INVENTOR(S) : Kenichi Imamiya et al.

It is certified that error appears in the above-identified patent and that said Letters Patent is hereby corrected as shown below:

<u>Title page,</u>
Item [56], References Cited, U.S. PATENT DOCUMENTS, "5,854,332" has been replaced with -- 5,845,332 --.

Signed and Sealed this

Twentieth Day of January, 2004

JON W. DUDAS
*Acting Director of the United States Patent and Trademark Office*